United States Patent
Cardoso et al.

(10) Patent No.: US 9,470,502 B2
(45) Date of Patent: Oct. 18, 2016

(54) FLUXGATE WITH LAMINAR DAMPING OF THE PENDULUM AND METHOD OF ASSEMBLING A FLUXGATE

(75) Inventors: Christian Cardoso, Paris (FR); Didier Habert, Paris (FR); Etienne Merlet, Paris (FR); Fabrice Jean, Paris (FR); Mickael Magalhaes, Paris (FR); Sebastien Pautard, Paris (FR)

(73) Assignee: SAGEM DEFENSE SECURITE, Paris (FR)

( * ) Notice: Subject to any disclaimer, the term of this patent is extended or adjusted under 35 U.S.C. 154(b) by 286 days.

(21) Appl. No.: 14/009,787

(22) PCT Filed: Apr. 19, 2012

(86) PCT No.: PCT/EP2012/057184
§ 371 (c)(1),
(2), (4) Date: Oct. 3, 2013

(87) PCT Pub. No.: WO2012/143456
PCT Pub. Date: Oct. 26, 2012

(65) Prior Publication Data
US 2014/0015519 A1    Jan. 16, 2014

(30) Foreign Application Priority Data

Apr. 22, 2011    (FR) ...................... 11 53511

(51) Int. Cl.
| | | |
|---|---|---|
| *G01B 7/00* | (2006.01) | |
| *G01C 17/30* | (2006.01) | |
| *G01R 33/00* | (2006.01) | |
| *G01R 33/04* | (2006.01) | |
| *G01R 33/09* | (2006.01) | |

(52) U.S. Cl.
CPC ............... *G01B 7/003* (2013.01); *G01C 17/30* (2013.01); *G01R 33/0005* (2013.01); *G01R 33/0047* (2013.01); *G01R 33/04* (2013.01); *G01R 33/093* (2013.01)

(58) Field of Classification Search
CPC ...... G01C 19/36; G01C 19/58; G01C 17/30; G01R 33/04; G01R 33/0005; G01R 33/0047; G01R 33/0206; G01R 33/093; G01R 33/025; H01Q 9/28; G01V 3/26; G01B 7/003; G01N 9/22
See application file for complete search history.

(56) References Cited

U.S. PATENT DOCUMENTS

| | | | | |
|---|---|---|---|---|
| 3,286,357 A | * | 11/1966 | Grumman ................ | G01C 9/06 33/366.25 |
| 3,641,679 A | | 2/1972 | Kesselring et al. | |
| 3,873,914 A | * | 3/1975 | Kesselring ............. | G01R 33/04 324/247 |

FOREIGN PATENT DOCUMENTS

| | | |
|---|---|---|
| FR | 2099925 | 3/1972 |
| FR | 2238162 | 2/1975 |

* cited by examiner

*Primary Examiner* — Vinh Nguyen
(74) *Attorney, Agent, or Firm* — Muncy, Geissler, Olds & Lowe, P.C.

(57) ABSTRACT

Flow valve including a casing containing an electromagnetic assembly for detecting a magnetic field. The electromagnetic assembly is fixed to a pendulum suspended by an articulation from a plate of the casing. The casing contains a liquid for damping the movements of the pendulum. The pendulum includes a surface opposite the articulation which has a spherical cap shape and which extends facing a wall of the casing of complementary shape, defining a space having dimensions suitable for producing a laminar rolling of the damping liquid between them when the pendulum is in motion.

17 Claims, 1 Drawing Sheet

FLUXGATE WITH LAMINAR DAMPING OF THE PENDULUM AND METHOD OF ASSEMBLING A FLUXGATE

BACKGROUND OF THE INVENTION

1. Field of the Invention

The present invention relates to a device having magnetometers and more specifically to a fluxgate. The invention also relates to a method for manufacturing such a fluxgate.

2. Brief Description of the Related Art

A fluxgate is a device for measuring the Earth's magnetic field, making it possible to determine the orientation of the Earth's magnetic field with respect to a reference axis.

When the fluxgate is mounted on an aircraft, the reference axis is aligned with the axis of movement of the aircraft, such that the fluxgate makes it possible to determine the aircraft's magnetic heading.

A fluxgate comprises two uniaxial magnetometers arranged perpendicular to one another in a substantially horizontal plane.

Every magnetometer comprises a core made of a material with high magnetic permeability, chosen such that the Earth's magnetic field is enough to bring the core into a state close to its saturation state. The cores are surrounded by a primary winding and a secondary winding. The primary winding is supplied by an alternating current in order to give rise, in the core, to a variation in the magnetic field which in turn produces a potential difference across the terminals of the secondary winding. Processing the signal which appears on the secondary winding makes it possible to determine very precisely the magnetic field component in the direction of the windings in question.

In order to isolate the magnetometers from the vertical component of the Earth's magnetic field, they must be held in a plane which is as horizontal as possible. To that end, the cores are mounted on a pendulum which is suspended below a plate. The pendulum is enclosed in a casing which is attached to the plate and which is filled with a liquid having a viscosity which is high enough to damp the movements of the pendulum.

This means that known fluxgates are relatively heavy and bulky.

Furthermore, a drop in temperature leads to an increase in the viscosity of the liquid, eventually preventing the pendulum from swinging. Thus, these fluxgates cannot be used below a certain temperature, specifically −2° C. for the most high performance ones. However, certain aircraft flying at high altitude, frequently experience such temperatures.

Documents FR 2 238 162 and FR 2 099925 describe such fluxgates.

BRIEF SUMMARY OF THE INVENTION

One aim of the invention is to provide a means for obviating—at least in part—the abovementioned drawbacks.

To that end, there is provided, according to the invention, a fluxgate comprising a casing containing an electromagnetic assembly for detecting a magnetic field, wherein the electromagnetic assembly is attached to a pendulum suspended from a wall of the casing by an articulation, wherein the casing contains a liquid for damping the movements of the pendulum, characterized in that the pendulum comprises, at the opposite end from the articulation, a surface which is in the shape of a spherical cap and extends facing a wall of the casing that has a form complementary to the form of the surface, defining a space having suitable dimensions to laminate the damping liquid between the surface and the wall when the pendulum moves.

This provides laminar damping of the pendulum, rather than volume damping as in the past. Indeed, the spherical cap shape of the surface of the pendulum and the matching shapes of the surface of the pendulum and of the wall of the casing, which lie facing each other, make it possible very advantageously to define a regular space of constant thickness between said surface and said wall. The liquid present in this space thus forms a film of constant thickness over a very large area, making it possible to establish easily a lamination of the film when the pendulum moves.

Document FR 2 238 162 describes a fluxgate the structure of which is not conducive to laminar damping. FIG. 1 of said document clearly shows that the pendulum does not have a surface in the shape of a spherical cap and that the shape of the wall of the casing which extends facing the pendulum does not match said surface. This wall is indeed visibly flattened in order to limit the volume of the fluxgate. The irregular nature of the space delimited by the surface of the pendulum, and the wall of the casing opposes lamination of the damping liquid.

In the same way, document FR 2 099925 describes a fluxgate the structure of which is not conducive to laminar damping since, as shown in FIG. 1, the fluxgate comprises an annular striker plate which creates turbulence at the boundary of the space delimited by the wall of the casing and the surface of the pendulum, which faces the former, thus making it impossible to laminate the damping liquid.

By contrast, by virtue of the invention, laminar damping of the pendulum is possible, such that:
 the necessary quantity of damping liquid can be reduced, such that the fluxgate is relatively compact and lightweight,
 a less viscous damping liquid can be used, allowing it to be used with no impairment of properties at lower temperatures, as low as −50° C. or even lower, and
 a damping liquid which is less dense and less sensitive to variation in temperature can be used.

Advantageously, said surface of the pendulum is bounded by a recessed surface portion in order to facilitate the entry of the damping liquid into the space, said surface being preferably frustoconical in shape.

This then creates a funnel effect which facilitates the penetration of the damping liquid into the space dedicated to lamination of the damping liquid, or even forces the damping liquid to penetrate therein.

Said surface of the pendulum advantageously features, adjacent to its periphery, openings through which the damping liquid can escape.

The escape openings make it possible to reduce the risk, of the damping liquid accelerating when it penetrates into the lamination space. Such an acceleration would prejudice the damping control provided by the damping liquid.

The invention also relates to a method for manufacturing a fluxgate wherein the electromagnetic detection assembly comprises two uniaxial magnetometers arranged perpendicular to one another and having end portions received in notches created in the pendulum, wherein the casing comprises an attachment plate from which the pendulum is suspended. The method involves the step of suspending the pendulum from the attachment plate and a stage of installing the magnetometers consisting of three steps:
 positioning the plate horizontally and allowing the pendulum to swing until it is stable, positioning the ends of the magnetometers in the notches of the pendulum while keeping the two magnetometers in a horizontal position and, without touching the pendulum, placing a drop of adhesive simultaneously in the four notches and polymerizing the adhesive.

Other features and advantages of the invention will become apparent upon reading the following description of a particular non-limiting embodiment of the invention.

BRIEF DESCRIPTION OF THE DRAWINGS

Reference is made to the appended drawings, in which.

DETAILED DESCRIPTION OF THE PREFERRED EMBODIMENTS

Figure 1:
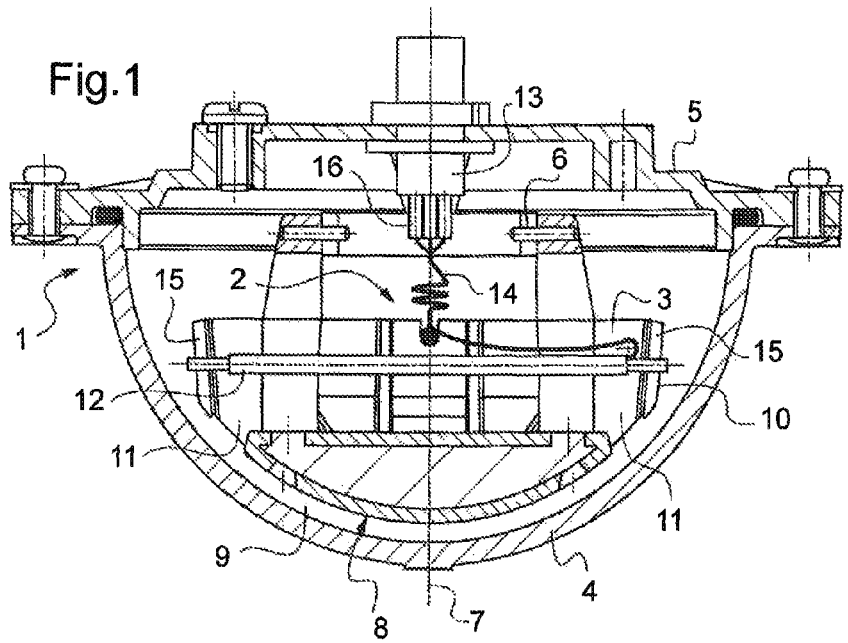
FIG. 1 is a view in axial section of a fluxgate according to the invention.
Figure 2:
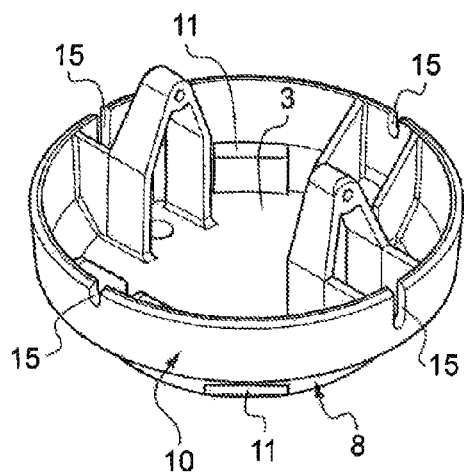
FIG. 2 is a view in perspective of the pendulum of this fluxgate before the magnetometers are installed.
Figure 3:
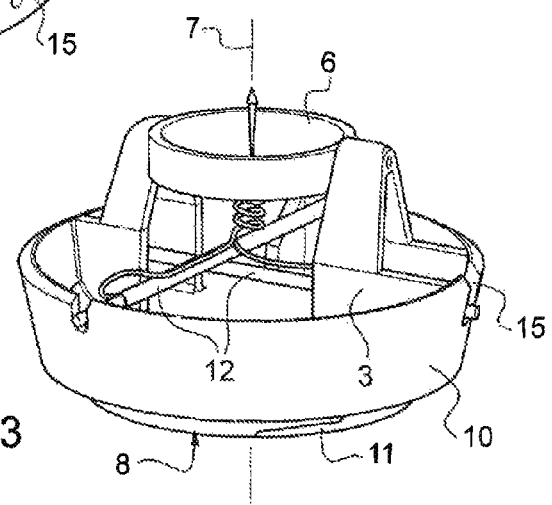
FIG. 3 is a view in perspective of the pendulum once fitted with the magnetometers.

With reference to the figures, the fluxgate comprises a casing, generally labeled 1, containing an electromagnetic assembly 2 for detecting a magnetic, field and a pendulum 3 which is suspended in the casing and supports the electromagnetic assembly 2.

The casing 1 comprises a wall 4 in the shape of a spherical cap, having circular edge delimiting an opening which is closed off by a plate 5 for attaching the fluxgate to a support.

The pendulum 3 is suspended from the plate 5 by a double articulation 6 comprising a ring connected to the plate 5, in order to pivot about a first axis, and connected to the pendulum 3, in order to pivot about a second axis perpendicular to the first axis and coplanar therewith. The means for connecting the ring to the plate 5 comprise two pivot connections with short centering shims and the means for connecting the ring to the pendulum 3 also comprise two pivot connections with short centering shims. For each axis, each pivot connection comprises a journal, having one end embedded in the pendulum or the plate and one opposite end received freely via a sliding fit in a hole pierced in the ring. The range of the fit is reduced to the greatest possible extent in order to prevent a deformation of the parts, inducing a misalignment of the journals, from giving rise to stresses which would, be prejudicial to the movement of the pendulum. As a variant, the pivot connections can be replaced by ball-ended connections in order to further limit the stresses which could arise from the journals being badly aligned, although this variant would be more costly. The double articulation 6 gives the pendulum an angular play of approximately 5 to 30° either side of a third axis which is normal to the plate and intersects the first axis and the second axis.

The pendulum 3 incorporates a mass which is balanced such that when at rest, with the plate horizontal, an axis 7, which passes through the pendulum's center of gravity and the intersection of the pivoting axes of the pendulum 3, is normal to the plate 5.

The pendulum 3 comprises, facing the wall 4, a surface 8 having a spherical cap shape centered on the axis 7. The surface 8 and the wall 4 delimit a laminating space 9. The surface 8 is surrounded by a recessed annular surface portion 10 and features, adjacent to its periphery, through openings 11.

The pendulum is preferably made of a thermoplastic material, in this case, containing no filler so as to aid precision and thermal geometric stability of the spherical surfaces, and incorporates an insert, for example made of metal, forming an inertial mass. The pendulum is advantageously manufactured in this case by injecting the thermoplastic material into a mold so as to overmold the thermoplastic material onto the insert. This manufacturing method makes it possible to: limit assembly operations; obtain a pendulum having a relatively smooth outer surface which is conducive to laminar damping; and optimise the relative positioning of the center of inertia of the pendulum, the center of rotation of the pendulum and the center of the cap. The thermoplastic material selected is for example a polyetherimide (PEI).

The electromagnetic assembly 2 comprises uniaxial magnetometers 12, which are known per se, comprising cores made of a ferromagnetic material with high magnetic permeability and which react to weak magnetic fields. The ferromagnetic material used here is more particularly an iron-nickel alloy with very high permeability, preferably greater than $1 \cdot 10^{-2}$ H/m. In this case, each core comprises strips of said material which are attached in a glass tube.

Two superposed windings surround the glass tube, the primary winding and the secondary winding of the magnetometer.

The magnetometers 12 extend, at 90° to each other and one above the other, parallel to the first axis and the second axis of the double articulation 6. The magnetometers 12 are separated from one another in order to avoid a magnetic coupling between them. The ends of the magnetometers 12 are attached to peripheral notches 15 of the pendulum 3 such that, when the pendulum 3 is free to swing and at rest, the magnetometers 12 are horizontal.

The windings are connected to a connector 13 mounted at the center of the plate 5. The connector 13 is for example a sealed cylindrical 5-pin microconnector. The wires connecting the windings to the connector 13 are twisted and held together by means of a drop of adhesive at the point where the wires diverge to join the windings. The twist 14 thus formed is shaped so as to not hamper the movements of the pendulum. The twist 14 is in this case in the shape of a two-turn pigtail. The twist 14 having this shape is arranged so as to extend, with the pendulum 3 at rest and the plate 5 horizontal, substantially around the axis 7 so as to minimize its influence on the swinging of the pendulum 3. As a variant, the twist can have another spiral shape, for example a flat spiral. As another variant, the twist 14 can be shaped so as to follow the axes of rotation of the double articulation 6, again such that its influence on the movements of the pendulum is minimized.

The twist 14 has an end portion which is embedded in a block of resin 16 which is secured to the connector 13 and which also holds the region for connecting the wires to the pins of the connector 13. The block of resin 16 makes it possible to increase the mechanical strength of the connection between the wires and the connector 13 and, more generally, to prevent a tensile force on the twist from generating a large stress either on the individual wires or on their connection with the connector.

A damping liquid fills a portion of the casing 1, in this case up to the upper edge of the pendulum 3.

The laminating space 9 thus receives damping liquid such that the damping liquid is laminated between the surface 8 and the wall 4. The annular recessed surface portion 10 defines, with the wall 4, a sort of funnel conducive to the damping liquid penetrating into the lamination space 9.

The radius of the pendulum 3 and of the internal surface of the wall 4 of the casing 1 which defines the thickness of the laminating space 9 are determined by applying for example Couette's viscometer theory.

Some steps of manufacturing the fluxgate must be performed carefully.

Installing the magnetometers 12 must be performed with great precision and comprises three steps:
- positioning the plate 5 horizontally and allowing the pendulum 3 to swing until it is stable,
- positioning the ends of the magnetometers 12 in the notches of the pendulum 3 while keeping the two magnetometers in a horizontal position and, without touching the pendulum 3,
- placing a drop of adhesive (the adhesive used is a very fluid adhesive) simultaneously in the four notches and polymerizing the adhesive.

This manufacturing method is particularly suitable in this case as it makes it possible to dispense with the adjustment members which are otherwise necessary in order to horizontally position and to attach the magnetometers. Such adjustment members could adversely affect the laminar character of the damping and are massive elements which are offset with respect to the pendulum's center of gravity. Moreover, removing the adjustment members makes the fluxgate more precise and robust with an extremely small risk of loss of adjustment over time.

The selected damping liquid is an oil having a kinematic viscosity of 5 mm$^2$/s at 25° C., a density of around 0.91 at 25° C., a freezing point of −65° C.

The thickness of the laminating space 9 is the result of a compromise taking into account the viscosity of the damping liquid and the chosen manufacturing method. Indeed, if a construction using injected thermoplastics is chosen, the minimum thickness which can be obtained will depend on whether or not a subsequent machining step is performed.

Of course, the invention is not limited to the embodiment described but encompasses any variant within the scope of the invention as defined by the claims.

In particular, the structure of the casing and the pendulum can be different to that described. The casing can have an external shape which is different to its internal shape in the form of a spherical cap.

The electromagnetic assembly can have a different structure and can comprise a torus.

Other damping liquids may be chosen, the properties of which are close to the values mentioned.

The invention claimed is:

1. A fluxgate comprising a casing containing an electromagnetic assembly for detecting a magnetic field, wherein the electromagnetic assembly is attached to a pendulum suspended from a plate of the casing by an articulation, wherein the casing contains a liquid for damping the movements of the pendulum, wherein the pendulum comprises, at the opposite end from the articulation, a surface which is in the shape of a spherical cap and extends facing a wall of the casing that has a form complementary to the form of the surface, defining a space having suitable dimensions to laminate the damping liquid between the surface and the wall when the pendulum moves.

2. The fluxgate as claimed in claim 1, wherein said surface of the pendulum is bounded by a recessed surface portion in order to facilitate the entry of the damping liquid into the space.

3. The fluxgate as claimed in claim 2, wherein the shape of the recessed surface portion is frustoconical.

4. The fluxgate as claimed in claim 1, wherein said surface of the pendulum features, adjacent to its periphery, openings through which the damping liquid can escape.

5. The fluxgate as claimed in claim 1, wherein the electromagnetic detection assembly comprises two uniaxial magnetometers arranged perpendicular to one another.

6. The fluxgate as claimed in claim 5, wherein the magnetometers have end portions received in notches created in the pendulum.

7. The fluxgate as claimed in claim 1, wherein the magnetometer assembly is connected to a connector, mounted on the plate, by wires gathered together in a twist.

8. The fluxgate as claimed in claim 7, wherein the twist is in a spiral shape the axis of which is substantially normal to the plate.

9. The fluxgate as claimed in claim 7, wherein the twist is shaped so as to substantially follow the axes of rotation of the articulation.

10. The fluxgate as claimed in claim 7, wherein connections between the wires and the connector are embedded in a block of resin which is secured to the connector.

11. The fluxgate as claimed in claim 7, wherein the twist has an end portion which is embedded in the block of resin.

12. The fluxgate as claimed in claim 1, wherein the pendulum comprises an insert forming an inertial mass covered by thermoplastic material.

13. The fluxgate as claimed in claim 12, wherein the pendulum is obtained by overmolding the thermoplastic material about the insert.

14. The fluxgate as claimed in claim 1, wherein the selected damping liquid has a kinematic viscosity of 5 mm2/s at 25° C., a density of 0.91 at 25° C. and a freezing point of 65° C.

15. The fluxgate as claimed in claim 1, wherein the articulation is connected to the plate and to the pendulum so as to allow the pendulum to move about two axes with two pivot connections for each axis.

16. A method for assembling a fluxgate in accordance with claim 1, wherein the electromagnetic detection assembly comprises two uniaxial magnetometers arranged perpendicular to one another and having end portions received in notches created in the pendulum, wherein the casing comprises an attachment plate from which the pendulum is suspended, the method involving the step of suspending the pendulum from the attachment plate and a step of installing the magnetometers consisting of:
- positioning the plate horizontally and allowing the pendulum to swing until it is stable,
- positioning the ends of the magnetometers in the notches of the pendulum while keeping the two magnetometers in a horizontal position and, without touching the pendulum, placing a drop of adhesive simultaneously in the notches and polymerizing the adhesive.

17. A fluxgate, comprising:
- a casing containing an electromagnetic assembly for detecting a magnetic field; and
- a pendulum suspended from a plate of the casing by an articulation, the electromagnetic assembly being attached to the pendulum,
- wherein the casing contains a liquid for damping the movements of the pendulum, and
- wherein the pendulum comprises, at the opposite end from the articulation, a surface which is in the shape of a spherical cap and extends facing a wall of the casing that has a form complementary to the form of the surface, defining a space having suitable dimensions to so that the liquid for damping is subjected to laminar damping between the surface and the wall when the pendulum moves.

\* \* \* \* \*